Feb. 7, 1967 R. CHARBONNIER 3,303,493

AMPLITUDE COMPARATOR SYSTEM

Filed Jan. 22, 1964

2 Sheets-Sheet 1

Roger Charbonnier
INVENTOR.

BY Michael P. Breston

ATTORNEY

AMPLITUDE COMPARATOR SYSTEM

Filed Jan. 22, 1964 2 Sheets-Sheet 2

Roger Charbonnier
INVENTOR.

BY Michael P. Breston

ATTORNEY

3,303,493
AMPLITUDE COMPARATOR SYSTEM

Roger Charbonnier, Meudon, Seine-et-Oise, France, assignor to Societe Rochar Electronique, Seine, France, a corporation of France Filed Jan. 22, 1964, Ser. No. 339,488
Claims priority, application France, Jan. 28, 1963, 922,926
9 Claims. (Cl. 340—347)

The invention relates to an amplitude comparator intended for delivering an output pulse when an input voltage equals a reference cyclic voltage (a saw-tooth voltage, for instance).

Various comparators of this type have been designed particularly in order to constitute devices for the conversion of a modulation voltage into a pulse of proportional duration. The principles applied to these various comparator circuits consist generally of closing the positive reaction loop of a blocking oscillator when the two voltages to be compared equal each other. In order to avoid a second operation of the blocking oscillator during the cycle of the reference voltage, different circuits of negative feedback are associated to it, which make inoperative the positive feedback loop as soon as the oscillator has worked.

In these devices, the efforts were more or less successfully directed towards delivering the logic output at the very moment of the equality between the two voltages to be compared. However, the usual utilization of a diode, switched in between the voltages to be compared, introduces necessarily an error which is not negligible, in consideration of the badly defined and instable thresholds of the diode.

In these different equipments, the problem of the variation of the load impedance presented to the input voltage has never been set forth, and, furthermore, solved. As a matter of fact, as soon as the reference voltage has passed the threshold constituted by the input voltage, the latter starts to deliver until the end of the cycle. This presents many disadvantages which have a direct effect on the accuracy of the voltage-to-time conversion.

It was tried to overcome these disadvantages by using a high input impedance amplifier separator, switched in between the input voltage and the comparison circuit. This solution is also applied in case of transistorized comparison circuits, in order that the low input impedance of the transistors could not disturb the measurement.

However, the use of an amplifier separator—besides its price—often introduces drifts or linearity errors which it is desirable to avoid.

Consequently, it is an object of the invention to provide a circuit with a logic output for the comparison of amplitudes which does not include any amplifier separator, but, however, which uses transistors and has an input impedance of very high value, at least during the times of non-equality between the voltages to be compared.

One circuit in accordance with this invention for the comparison of the amplitudes of an input voltage and a reference cyclic voltage, and for delivering a logic signal at the moment of equality between these two voltages comprises a comparator circuit preferably in the form of a transistorized differential amplifier wherein the input voltage is applied to the base of an input transistor and the reference cyclic voltage is applied through an asymmetrically conductive element to the emitter of the input transistor. The sign and amplitude at the origin of the reference voltage are chosen in order that the input transistor should be blocked except at the instant of equality . The output of the differential amplifier is connected to the input of a bistable circuit adapted to reverse states as soon as a predetermined current flows through the input transistor, the output of the bistable circuit being connected by a unidirectional feedback circuit, to one of the control electrodes of the differential amplifier, in order that the reversing of the bistable circuit causes the return to a blocked state of the input transistor and that, in this way, the value of the impedance of the base of the input transistor is very high during the whole time of non-equality of the voltages to be compared. The action of the circuit employed for the return to resting position of the bistable circuit is approximately synchronous with the instant of commencement of a cycle of the reference cyclic voltage.

A primary advantage of this invention lies in the fact that the input impedance of the comparison circuit is very high because the input circuit consists of the base of a blocked transistor which becomes conductive only during the very short instant of equality between the input voltage and the reference cyclic voltage to which the former voltage is compared.

Other characteristics and advantages of the invention will appear more clearly in the following description when taken in conjunction with the attached drawings in which.

Figure 1:
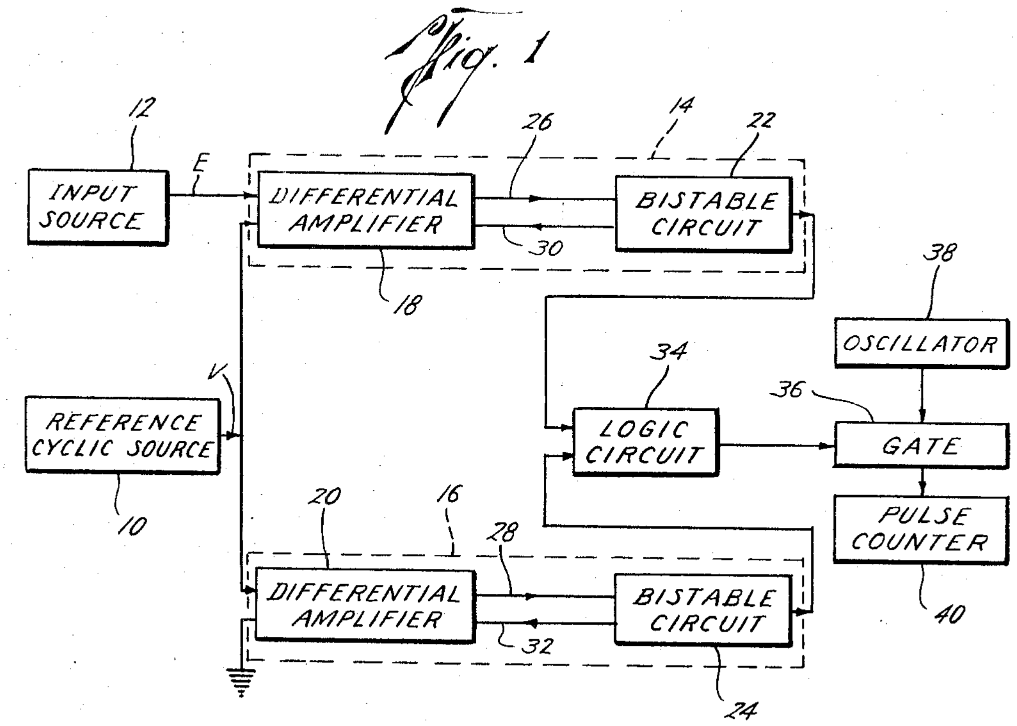
FIGURE 1 is a block diagram illustrating a digital voltmeter of the voltage-to-time conversion type.

Referring to FIGURE 1, a reference signal generator 10 delivers a reference cyclic voltage having a positive slope of the form $V=at$ ($a$ being a coefficient of proportionality and $t$ being time).

The voltage V increases linearly from $-V_0$ to $+V_0$ and, as soon as the maximum value is reached, V comes back quickly to its initial value, this phenomenon being repeated in a cyclic manner, preferably at a frequency of a few cycles per second.

In 12 is a voltage source, the unknown output voltage E of which is to be measured. In 14 is a first comparator circuit according to the invention, which receives the reference cyclic voltage V and the input voltage E.

Circuit 16 is a second comparator circuit according to the invention, the first input of which is connected to the output of the circuit 10, and the second input is grounded. Each one of the comparator circuits 14 and 16 consists of a comparison transistor circuit 18 or 20, followed by a bistable circuit 22 or 24, connected to the comparison transistor circuit by a direct connection 26 or 28 and a feed-back connection 30 or 32. The outputs of the bistable circuits 22 and 24 are connected to the electrodes controlling the opening and closing of a relay circuit 34 adapted for delivering a control square wave to a gate 36 the input of which is connected to a reference oscillator 38, and the output of which is applied to the input of a pulse counter 40.

Figure 2:
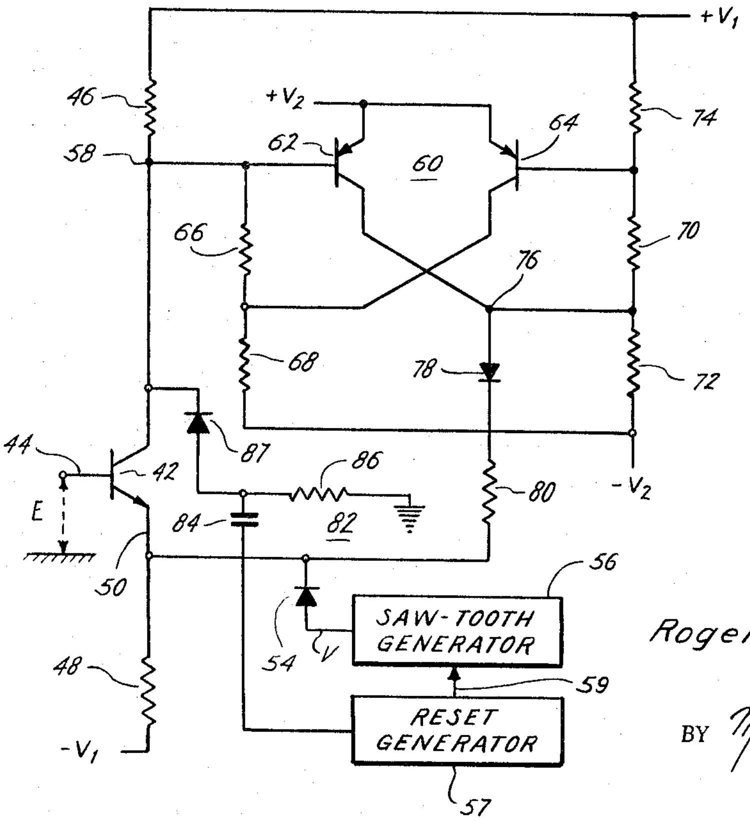
FIGURE 2 is a schematic diagram of a comparison circuit according to a simplified embodiment of the invention.

In FIGURE 2, 42 is an npn transistor, connected as an amplifier, to the base 44 of which is applied the voltage E. The transistor 42 includes a resistor 46 in its collector circuit, and a resistor 48 in its emitter circuit, these resistors being respectively connected to voltage sources $+V_1$ and $-V_1$. To the emitter 50 of the transistor 42 is connected, by a diode 54, the output of a saw-tooth voltage generator 56 which delivers a voltage of negative slope ($V=-at$). The terminal 58, to which are connected the collector of the transistor 42 and the resistor 46, is connected to the input of a bistable circuit 60 including the transistors 62 and 64 to which are associated, in a known way, the resistors 66, 68, 70, 72 and 74. The values of these resistors, and of the potentials $+V_2$ and $-V_2$, to which the resistors and transistors are connected, are chosen in such a way that the resting state of the bistable circuit 60 should make no difference.

The output terminal 76 of the circuit 60 is connected, by a diode 78 and a resistor 80, to the emitter 50 of the transistor 42. Besides, the output of a reset circuit 57 is applied to a derivating circuit 82 consisting of a capacitor 84 and of a resistor 86, the circuit 82 being connected by a diode 87 to the input 58 of the bistable circuit 60.

The FIGURE 1 represents the general diagram of a digital voltmeter of the voltage-to-time conversion type. As a matter of fact, the logic relay circuit 34 provides a square-wave, the duration of which is proportional to the absolute value of the voltage E delivered by the source 12. The coefficient of proportionality is directly determined by the value $a$ of the slope of the voltage V delivered by the source 10. Therefore, the oscillator 38, which delivers a stable frequency $F_0$, is connected to the counter 40 during the duration $\tau$ of the square-wave delivered by the circuit 34. In these conditions, the number of pulses counted by the counter 40 is directly proportional to the value of the voltage E.

Obviously, the performance of such a digital-voltmeter depends directly on the quality of the logic output comparator circuits 14 and 16 included in the device. The main quality required from these comparison circuits is, on the one hand, to have an input impedance as high as possible, in order not to disturb the voltage E delivered by the source 12, and, on the other hand, to deliver the output logic signal at an instant as close as possible to the exact instant when the voltages delivered by the generators 10 and 12 are exactly equal to each other.

Obtaining a very high input impedance with a transistorized circuit, without using any separator amplifier, obliges to design the circuit in a very special way.

The comparison circuit described on the FIGURE 2 shows how this can be reached.

The negative slope voltage delivered by the generator 56, and which goes from $+V_0$ to $-V_0$, according to a linear function $V=-at$, delivers to the resistor 48, through the diode 54, a current of decreasing value. The diode 78 isolates the circuit 60 from the transistor 42 during the resting time of this circuit.

As the quantity $V_0$ has been chosen much higher than the maximum value (positive or negative) of the input voltage E, the transistor 42 (of npn type) is blocked at the origin instant of the voltage V. As soon as the value of the voltage V draws nearer to the value of the voltage E, the input transistor 42 unblocks progressively and works as a differential amplifier. At the instant of equality of the voltages E and V, the voltage drop in the resistor 46, following the unblocking of the transistor 42, is chosen sufficient for reversing the bistable circuit 60. As soon as this reversing has been made, the diode 78 and the resistor 80 apply to the emitter 50 a positive voltage, the value of which, determined by the value of the resistors 80 and 48, is chosen sufficient for blocking the transistor 42, whatever the amplitude of the voltage E. Then, the diode 54 isolates the generator 56 from the transistor 42. The transistor 42 being blocked, the voltage at 58 varies, but, in consideration of the hysteresis of the bistable circuit 60, this variation is not sufficient for turning the bistable circuit 60 to its resting state. Thanks to the circuit according to the invention, the input transistor 42, which is the organ of comparison of the amplitudes, turns to the conductive state only during the short instant of equality of the voltages E and V. Therefore, the quantity of electricity taken from the source E, for comparing the voltages E and V, is as low as possible.

As the flip-flop 60 remains in its conductive state during the whole duration of the slope V which follows the short conductive period of the input transistor 42, the bistable circuit 60 must be turned back to its resting state in order that a new cycle of comparison could be effected. This is obtained at the origin instant of the voltage V by means of the reset circuit 57 associated to the deriving circuit 82 and to the diode 87. As a matter of fact, a strong positive pulse is applied to the base of the transistor 62 a little while before the origin instant of V: then, the transistor 62 blocks and the transistor 64 turns back to its conductive state.

Obviously, such a circuit ensures, in acceptable conditions, the comparison between the voltage E and the reference cyclic voltage V, but, in consideration of the difference between the characteristics of the diode 54 and of the emitter-base diode of the transistor 42, this circuit is of reduced performance.

Figure 3:
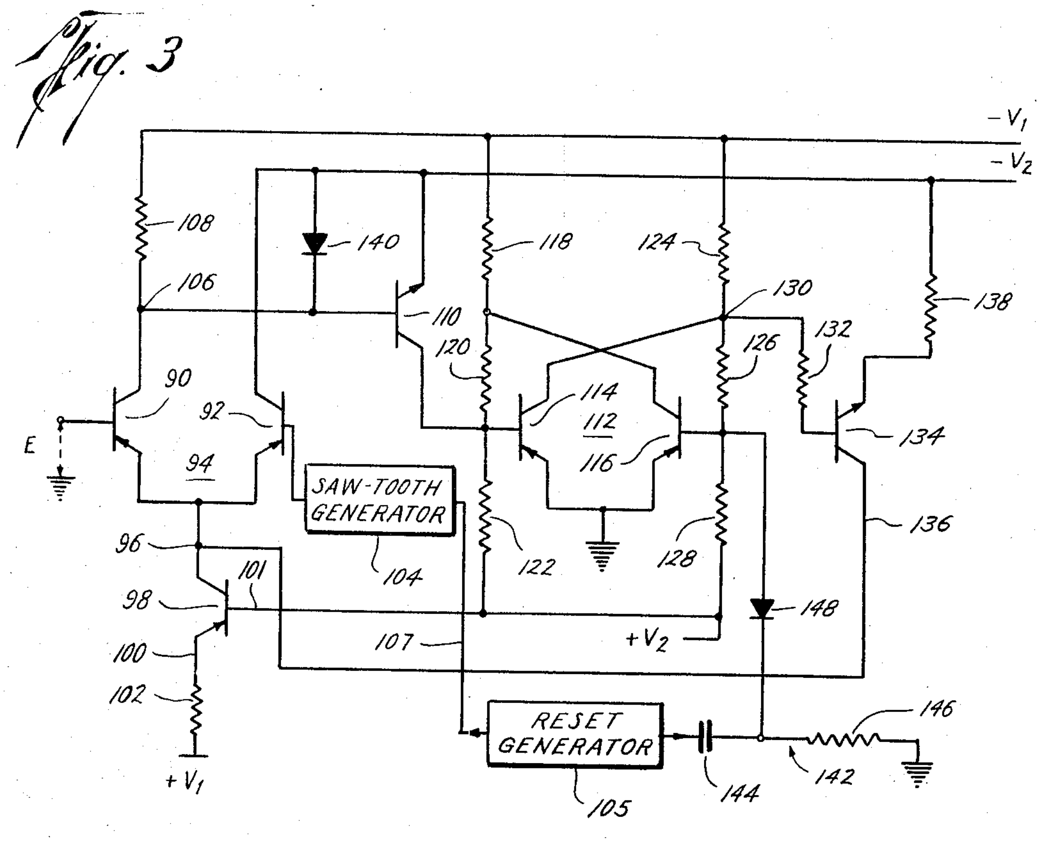
FIGURE 3 is a schematic diagram of a comparison circuit according to another embodiment of the invention.
Figure 4:
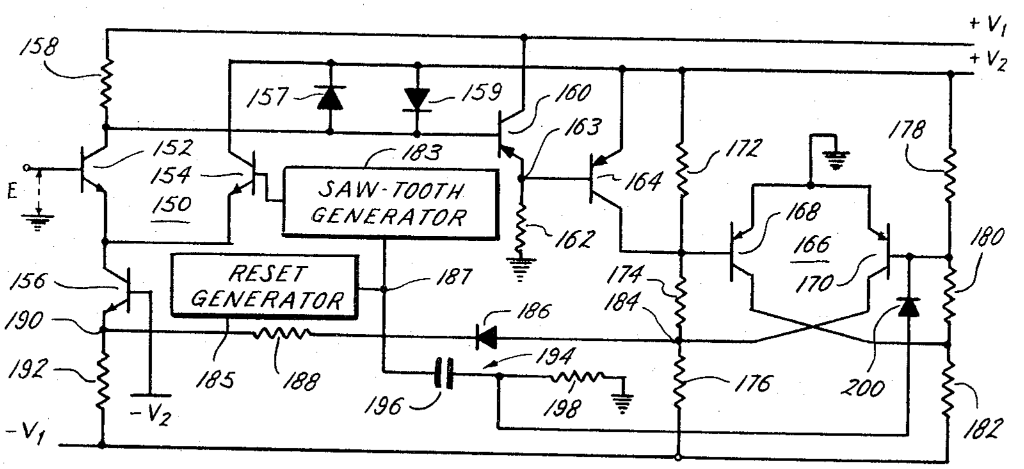
FIGURE 4 is a schematic diagram of a comparison circuit according to a preferred embodiment of the invention.

FIGURES 3 and 4 show other embodiments of comparison circuits according to the invention, the performances of which are much higher than those of the circuit shown in FIGURE 2.

According to FIGURE 3, the voltage E is applied to the base of a pnp transistor 90, associated to another pnp transistor 92, to constitute a differential amplifier 94. The emitters of the transistors 90 and 92 are both connected to the collector 96 of a pnp transistor 98, the emitter 100 of which is connected through a high value resistor 102, to the source $+V_1$ and the base 101, to a source $+V_2$ (with $V_2<V_1$).

The base of the transistor 92 is connected to the output of a cyclic voltage generator 104 which delivers a voltage of positive slope ($V=at$) which varies from $-V_0$ to $+V_0$. The collector 106 of the transistor 90 is connected to a negative voltage source $-V_1$, by a resistor 108. The collector of the transistor 92 is directly connected to the source $-V_2$. The collector 106 is connected to the base of the npn transistor 110, the emitter of which is connected to the source $-V_2$, and the collector, to the input of a bistable circuit 112, consisting of both pnp transistors 114 and 116.

To the transistors 114 and 116 are associated, in a known way, the resistors 118, 120, 122, 124, 126 and 128.

The values of these resistors and those of the positive potentials $V_1$ and $V_2$, to which they are connected, are such that the resting state of the flip-flop 112 makes no difference.

The collector 130 of the transistor 114 is connected, by a resistor 132, to the base of a npn transistor 134, the collector 136 of which is connected to the point of junction 96 of the emitters of the transistors 90 and 92, and of the collector of the transistor 98. A resistor 138 is connected to the emitter of the transistor 134, whereas a diode 140 is connected to the base of the transistor 110.

The output of the reset generator 105 is also applied to a derivation circuit 142 consisting of a capacitor 144 and a resistor 146, this circuit being connected by a diode 148 to the base of the transistor 116.

At the origin instant of the voltage of positive slope V delivered by the generator 104, the transistor 92 conducts and the transistor 90 is blocked. A constant current, delivered by the transistor 98, runs through the transistor 92. When the voltages E and V closely approach equality, the transistor 90 starts progressively to conduct, the current delivered by the transistor 98 is equally distributed between the transistors 90 and 92, and the device works as a differential amplifier which presents the advantage, in relation to the comparator of the FIG. 2, to perform the exact compensation of the base-emitter voltages of the transistors 90 and 92. At the moment of equality of the currents in the transistors 90 and 92, the voltage variation which appears at junction 106 is sufficient after a middle-sized amplification obtained by the transistor 110 to cause transistor 114 to become fully conductive and the bistable circuit 112 to reverse. The diode 140 limits the voltage excursion on the base of the transistor 110. As soon as the transistor 114 turns to the conductive state, so does also the transistor 134, and, in these conditions, the whole current produced by the transistor 98 flows through the transistor 134, thus causing both transistors 90 and 92, which constitute the differential amplifier 94, to block. As for the bistable circuit 60 on Fig. 2, the conductor state of the circuit 112 is maintained, although the voltage at junction 106 has returned to its initial value. The return to resting state of the bistable circuit 112 is insured by the deriving circuit 142 and the diode 148, which apply to the base of the pnp transistor 116 a negative pulse of great amplitude.

Therefore, the comparison circuit according to the invention permits, in consideration of the differential amplifier 94 of constant current, to compare, with a very high accuracy, the voltages E and V without taking a significant quantity of electricty from the source E.

The circuit shown in FIGURE 4 permits further improvement of the performances of the comparator circuit according to the invention. It consists essentially of a differential amplifier 150 which includes two npn transistors 152 and 154, the emitters of which are connected to the collector of a npn transistor 156 adapted for delivering a constant current. The resistor 158 placed in the collector circuit of the transistor 152 is connected to the base of the pnp transistor 160 mounted as an emitter-follower by means of a resistor 162.

Two threshold diodes 157 and 159 are mounted in the opposite direction to each other between the base of the transistor 160 and the potential $+V_2$.

The emitter 163 of the transistor 160 is connected to the base of a pnp transistor 164 mounted as an emitter-common amplifier. The output of the transistor 164 is connected to the input of a bistable circuit 166 composed of pnp transistors 168 and 170 associated in a known way to the resistors 172, 174, 176, 178, 180 and 182.

On the base of the transistor 152 is applied the voltage E, and to the base of the transistor 154 is applied the output of a generator 183 which delivers a cyclic voltage V of negative slope.

The collector 184 of the transistor 170 is connected by a diode 186 and a resistor 188 to the emitter 190 of the transistor 156, the emitter 190 being connected by a high value resistor 192 to a source of potential $-V_1$. Besides, the output of the reset generator 185 is connected to a deriving circuit 194 composed by a capacitor 196 and a resistor 198, the deriving circuit being connected by a diode 200 to the base of the transistor 170.

At the origin instant of the voltage V, the transistor 154 conducts and the transistor 152 is blocked. The transistor 156 imposes a constant value to the current which runs through the transistor 154, and this, whatever the instantaneous amplitude of the voltage V.

By a process similar to those described in the comments related to the operation of the devices on the FIGS. 2 and 3, at the moment of equality of the voltages E and V, both transistors 152 and 154 conduct simultaneously, constituting then a high performance differential amplifier. In these conditions, the transistor amplifiers 160 and 164 apply, to the base of the transistor 168, a strongly positive voltage which blocks the transistor 168 and sets the transistor 170 in a conductive state.

In consequence to this reversing of the bistable circuit 166, the transistor 156 is blocked because of the link established between the collector 184 of the transistor 170 and the emitter 190 of the transistor 156, by the diode 186 and the resistor 188. As the two transistors 152 and 154 which constitute the differential ampifier 150 are not supplied, they are blocked and the transistor 152 recovers its high input impedance. Owing to the presence of the threshold diodes 157 and 159, between the voltage $+V_2$ and the base of the transistor 160, the voltage variations on the emitter 163 of the transistor 160 are very quick and of very low amplitude, since the diodes limit within a small range the excursion of the voltage applied to the base of the transistor 160. By choosing transistors 152 and 154 so that they are correctly matched, it is possible to perform a very accurate comparison of the voltages E and V, as the reversing of the bistable circuit 166 is then obtained in optimum conditions. Experience has proved that variations of a few tenths of microvolts of the differential voltage existing between the voltage V and the input voltage E were sufficient for effecting reversal of the circuit 166.

As in the two preceding cases, the differentiating circuit 194 and the diode 200 set the circuit 166 back to resting position at the origin instant delivered by the generator 185.

Therefore, the use of devices such as those described on the FIGURES 2, 3, 4, for the construction of the comparator circuits 14 and 16 on the FIG. 1 permits, according to the case, to realize digital voltmeters of low, middle or high performances, this specially, owing to the quality and accuracy of the comparison effected between the voltages produced by the sources 12 and 10.

In order to realize a differential voltmeter, and to measure a quantity $E_1-E_2$, it is sufficient to connect $E_2$ to the input previously grounded of the comparison circuit 16. Obviously, the measurement is possible only if $E_1$ and $E_2$ have both an amplitude lower than $V_0$.

Also, it is possible to use the amplitude comparators according to the invention for constituting analog-to-digital converters of all kinds, and particularly, of non-linear type, by choosing a suitable wave form for the reference cyclic voltage.

While I have illustrated and described the best forms of preferred embodiments of my invention, it will be apparent to those skilled in the art that changes may be made in the form of the apparatus without departing from the spirit of my invention as set forth in the appended claims.

What is claimed is:

1. A system for comparing the amplitude of an input voltage with the amplitude of a reference voltage and for providing an output logic signal at the instant of equality between the amplitudes of said voltages comprising the combination of a source of cyclicly varying reference voltage;

a source of input voltage to be compared to said reference voltage;

first comparator circuit means having input terminals to which said reference voltage source and said input voltage source are directly connected and an output terminal, said first comparator circuit means being responsive to the relative amplitudes of said input and reference voltages to provide at said output terminal a logic signal the duration of which is a function of said amplitudes;

second comparator circuit means having a first input terminal to which said reference voltage source is directly connected, a second input terminal directly connected to a point of constant reference potential, and an output terminal;

logic circuit means responsive to the outputs of said first and second comparator circuits for providing a pulse waveform, the duration of each pulse in said waveform being proportional to the absolute value of the amplitude of said input voltage;

signal generator circuit means for providing a signal of predetermined frequency; and a gate circuit having an output terminal, said gate circuit being responsive to said signal and to said pulse waveform for providing at said terminal a series of pulses, the number of pulses in said series being directly proportional to the amplitude of said input voltage, said second comparator circuit means being operative to repetitively provide at said second comparator output terminal a pulse the duration of which is a function of the waveform of said cyclicly varying reference voltage.

2. A system for comparing the amplitude of an input voltage with the amplitude of a cyclicly varying reference voltage and for providing an output logic signal at the instant of equality between the amplitudes of said voltages, comprising the combination of a first comparator circuit responsive to said input voltage and to said reference voltage, said comparator circuit comprising a differential amplifier, a bistable circuit for providing an output pulse responsive to the output of said differential amplifier, said bistable circuit reversing states when the amplitude of said reference voltage becomes equal to the amplitude of said input voltage, and a unidirectionally conducting element coupling said output pulse to a control terminal on said differential amplifier for rendering ineffective the input circuit of said differential amplifier whereby the input impedance of said differential amplifier becomes very high during the entire time of nonequality of the voltages to be compared;

a second comparator circuit responsive to said reference voltage;

a logic circuit responsive to the outputs of said first and second comparator circuits for providing a pulse waveform, the duration of each pulse in said waveform being proportional to the absolute value of the amplitude of said input voltage;

a signal generator for providing a signal of predetermined frequency; and a gate circuit having an output terminal, said gate circuit being responsive to said signal and to said pulse waveform for delivering to said output terminal a series of pulses, the number of pulses in said series being directly proportional to the amplitude of said input voltage.

3. The comparison system of claim 2 and further including a reset circuit for resetting said bistable circuit to a rest position, the action of said reset circuit being approximately in synchronism with the origin instant of said reference cyclic voltage.

4. The system of claim 2 wherein said differential amplifier comprises at least one transistor having a base, emitter and collector electrodes, a first unidirectionally conducting element for coupling said reference voltage to said emitter, and a second unidirectionally conducting element for coupling said output pulse to said emitter.

5. The system of claim 2 and further including a high gain amplifier for coupling the output of said differential amplifier to the input of said bistable circuit.

6. The system of claim 4 wherein said utilization device is a pulse counter.

7. The system of claim 2 wherein said differential amplifier comprises a pair of transistors each having a base, emitter, and collector electrodes and further comprising:

a current source, means coupling the emitters of said pair of transistors to the output of said current source, the base electrode of one of said transistors being responsive to said input voltage, and the base electrode of the other of said transistors being responsive to said reference voltage.

8. The system of claim 7 and further comprising a high gain transistor amplifier coupled between said differential amplifier and said bistable circuit.

9. The system of claim 8 and further including a pair of threshold diodes mounted in oppositely poled directions across the input circuit of said high gain amplifier.

References Cited by the Examiner

FOREIGN PATENTS 650,092 10/1962 Canada.

MAYNARD R. WILBUR, *Primary Examiner.*

W. J. ATKINS, AL NEWMAN, *Assistant Examiners.*